United States Patent
Li et al.

(10) Patent No.: US 8,681,283 B2
(45) Date of Patent: Mar. 25, 2014

(54) METHOD AND RESULTING CAPACITOR STRUCTURE FOR LIQUID CRYSTAL ON SILICON DISPLAY DEVICES

(75) Inventors: Wei Min Li, Shanghai (CN); Herb H. Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 163 days.

(21) Appl. No.: 13/081,471

(22) Filed: Apr. 6, 2011

(65) Prior Publication Data

US 2012/0081649 A1   Apr. 5, 2012

(30) Foreign Application Priority Data

Apr. 16, 2010 (CN) .......................... 2010 1 0154836

(51) Int. Cl.
*G02F 1/1368* (2006.01)
(52) U.S. Cl.
USPC ............................................................ 349/47
(58) Field of Classification Search
None
See application file for complete search history.

(56) References Cited

U.S. PATENT DOCUMENTS

| | | | | |
|---|---|---|---|---|
| 5,745,195 A | * | 4/1998 | Zhang | 349/39 |
| 5,777,701 A | * | 7/1998 | Zhang | 349/44 |
| 6,100,947 A | * | 8/2000 | Katayama | 349/38 |
| 7,554,616 B1 | * | 6/2009 | Takemura | 349/38 |
| 2004/0114075 A1 | * | 6/2004 | Iwasa | 349/113 |
| 2007/0177068 A1 | * | 8/2007 | Zhang et al. | 349/44 |
| 2008/0129911 A1 | * | 6/2008 | Huang et al. | 349/44 |

FOREIGN PATENT DOCUMENTS

CN         1202682 A     12/1998

* cited by examiner

*Primary Examiner* — Thanh-Nhan P Nguyen
(74) *Attorney, Agent, or Firm* — Kilpatrick Townsend & Stockton LLP

(57) ABSTRACT

A liquid crystal on silicon display device (LCOS) has a semiconductor substrate comprising a surface region and a gate dielectric layer overlying the surface region. The device also has a word line formed overlying the gate dielectric layer and a first source/drain region coupled to the word line. The device has a bottom electrode structure formed overlying an interlayer dielectric. A capacitor dielectric is formed overlying the bottom electrode. A top electrode structure is formed overlying the capacitor dielectric to form a capacitor structure including the bottom electrode structure, the capacitor dielectric, and the top electrode structure. The device has a mirror surface formed overlying the top electrode structure to form a pixel electrode structure and a liquid crystal material provided overlying the mirror surface. In an embodiment, the LCOS described above is in an integrated circuit chip that also includes a DRAM device.

23 Claims, 8 Drawing Sheets

METHOD AND RESULTING CAPACITOR STRUCTURE FOR LIQUID CRYSTAL ON SILICON DISPLAY DEVICES

CROSS REFERENCES TO RELATED APPLICATIONS

This application claims priority to Chinese Application No. 201010154836.9, filed Apr. 16, 2010, commonly assigned, and hereby incorporated by reference for all purpose herein.

BACKGROUND OF THE INVENTION

The present invention is directed to integrated circuits and their processing for the manufacture of electronic devices. More particularly, the invention provides a method for manufacturing an electrode structure for a liquid crystal on silicon ("LCOS") device for displays. But it would be recognized that the invention has a much broader range of applicability.

Electronic display technologies have rapidly developed over the years. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator often uses electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc.

Yet another technique is called liquid crystal on silicon (LCOS), which uses both mirrors and liquid crystals. LCOS uses liquid crystals applied to a reflective mirror substrate. As the liquid crystals "open" or "close," light is reflected or blocked, which modulates the light to create an image for display. Often times, there are at least three LCOS chips, each corresponding to light in red, green, and blue channels. LCOS, however, has many limitations. As merely an example, LCOS is often difficult to manufacture. Additionally, LCOS requires at least the three chips that make the projector bulky and heavy and leads to high costs. Accordingly, LCOS has not been adapted to portable projectors.

From the above, it is seen that an improved technique for processing devices is desired.

SUMMARY OF THE INVENTION

The present invention is directed to integrated circuits and their processing for the manufacture of electronic devices. More particularly, the invention provides a method for manufacturing an electrode structure for a liquid crystal on silicon ("LCOS") device for displays. But it would be recognized that the invention has a much broader range of applicability.

In a specific embodiment, the present invention provides a liquid crystal on silicon display device, commonly called LCOS. The device has a semiconductor substrate comprising a surface region and a gate dielectric layer overlying the surface region of the semiconductor substrate. The device also has a word line formed overlying the gate dielectric layer overlying the surface region of the semiconductor substrate and a first source/drain region coupled to the word line. The device includes a second source/drain region coupled to the word line to form an MOS transistor device from the word line, first source/drain region and second source/drain region. A first interlayer dielectric is formed overlying the word line, first source/drain region, and second source drain region. A first plug structure is formed within a first portion of the first interlayer dielectric and coupled to the first source/drain region. A second plug structure is formed within a second portion of the first interlayer dielectric and coupled to the second source/drain region. The device has a second interlayer dielectric formed overlying the first interlayer dielectric and a bottom electrode structure formed overlying the second interlayer dielectric, the bottom electrode structure being coupled to the second plug structure through a via in the second interlayer dielectric. A capacitor dielectric is formed overlying the bottom electrode. A top electrode structure is formed overlying the capacitor dielectric to form a capacitor structure including the bottom electrode structure, the capacitor dielectric, and the top electrode structure. The device has a mirror surface formed overlying the top electrode structure to form a pixel electrode structure and a liquid crystal material provided overlying the mirror surface. The capacitor structure is configured to store a voltage potential for the pixel electrode structure to cause an on-state of the liquid crystal material or the capacitor structure is configured to be free from a voltage potential for the pixel electrode structure to cause an off-state of the liquid crystal material.

In another embodiment of the invention, an integrated circuit chip includes a liquid crystal on silicon (LCOS) display device as described above and a dynamic random access memory (DRAM) device.

In yet another embodiment, a method for forming a liquid crystal on silicon (LCOS) display device is provided.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration of conventional DRAM designs and LCOS devices. Preferably, the invention provides a multi-purpose capacitor design and electrode for LCOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of electronic devices. More particularly, the invention provides a method for manufacturing an electrode structure for a liquid crystal on silicon ("LCOS") device for displays. But it would be recognized that the invention has a much broader range of applicability.

Figure 1:
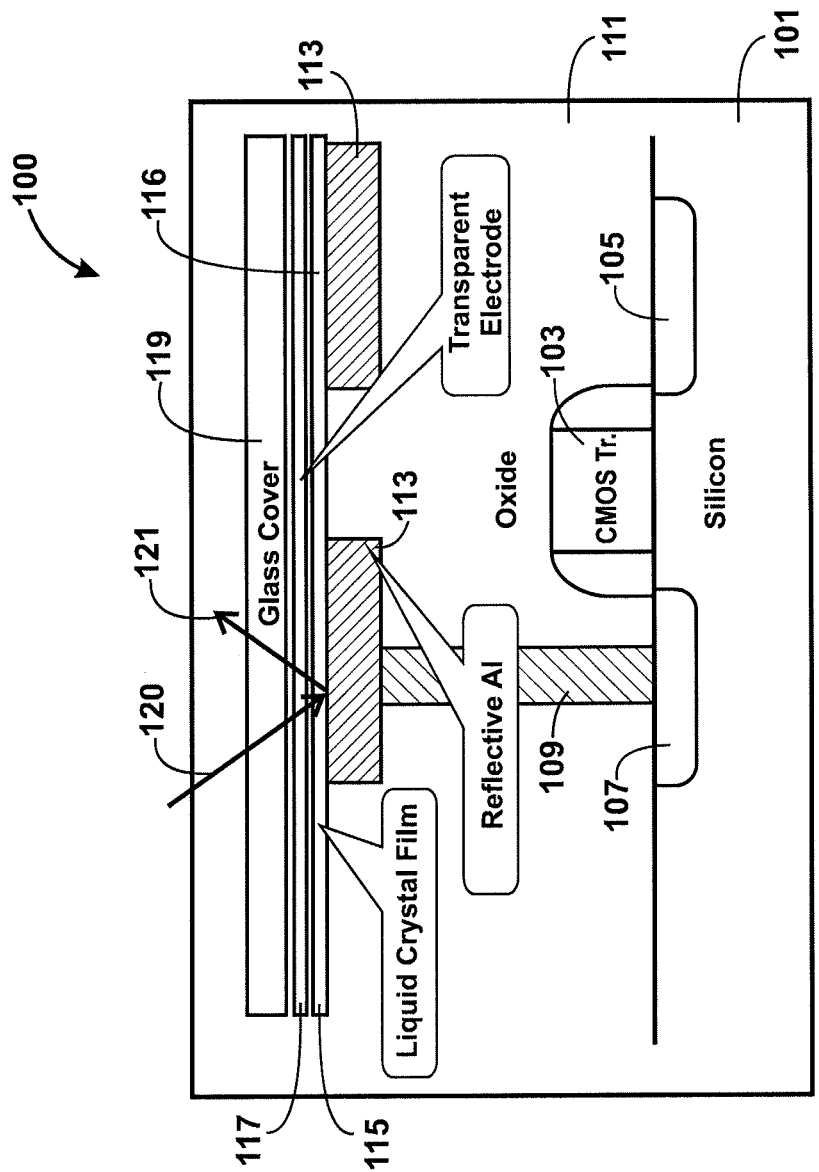
FIG. 1 is a simplified cross-sectional view diagram of an LCOS device according to an embodiment of the present invention.

FIG. 1 is a simplified cross-sectional view diagram of an LCOS device 100 according to an embodiment of the present invention. This diagram is merely an example, which should not unduly limit the scope of the claims herein. One of ordinary skill in the art would recognize many variations, alternatives, and modifications. As shown, the LCOS device 100 has a semiconductor substrate 101, e.g., silicon wafer. An MOS device layer 103 is formed overlying the semiconductor substrate. Preferably, the MOS device layer has a plurality of MOS devices. Each of the MOS devices has a contact region 107 for an electrode and a contact region 105 for a voltage potential. A planarized interlayer dielectric layer 111 is formed overlying the MOS device layer. The LCOS device also has a plurality of recessed regions within a portion of the interlayer dielectric layer and a metal layer (e.g., aluminum) to fill each of the recessed regions to form respective plurality of electrode regions 113 corresponding to each of the recessed regions. Each of the electrode regions is respectively coupled to at least one of the MOS devices among the plurality of MOS devices via interconnect structure 109, which may be a plug or other like structure. A protective layer is formed overlying surface regions of each of the plurality of electrode regions to protect the surface regions. A mirror finish 116 is on each of the surface regions. Preferably, the mirror finish is substantially free from dishes and scratches from a chemical mechanical polishing process. Each of the electrodes may have a thickness ranging from about 2000 Angstroms to about 4000 Angstroms and can be at other dimensions. Each of the electrodes represents a pixel element in an array of pixel elements for the LCOS device. Also shown are liquid crystal film 115 overlying the electrodes. The LCOS device also has a transparent electrode layer (e.g., indium tin oxide) 117 and an overlying glass plate 119 to enclose the multilayered structure. The LCOS device also has a capacitor (not shown) coupled to the electrode to help store charge to maintain a desired voltage level on the electrode for turning a liquid crystal film on or off depending upon the application. Details on ways of operating the LCOS device can be found throughout the present specification and more particularly below.

To operate the LCOS device, light 120 traverses through the glass cover, through the transparent electrode, and to the liquid crystal film. When the electrode is not biased, the liquid crystal film is essentially in the off position, which does not allow the light to pass therethrough. Rather, light is blocked and does not reflect off of the mirror surface of the electrode. When the electrode is biased via MOS device, the liquid crystal film is in an on-position, which allows light to pass 121. The light reflects off of the surface of the electrode and through the liquid crystal film, which is in an on-position. Preferably, the mirror surface is substantially free from imperfections. Accordingly, at least 93% of the incoming light passes out 121 of the LCOS device. Details of an improved capacitor structure according to an embodiment of the present invention can be found throughout the present specification and more particularly below.

Figure 2:
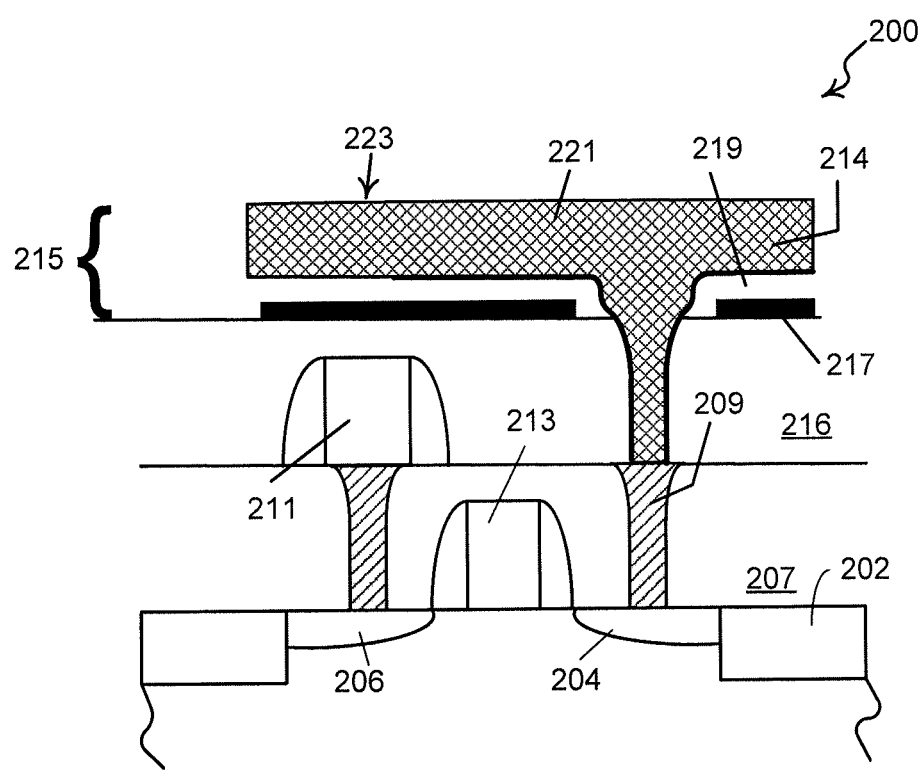
FIG. 2 is a more detailed cross-sectional view diagram of an LCOS device according to an embodiment of the present invention.

FIG. 2 is a more detailed cross-sectional view diagram of an LCOS device 200 according to an embodiment of the present invention. This diagram is merely an example, which should not unduly limit the scope of the claims herein. One of ordinary skill in the art would recognize many variations, alternatives, and modifications. As shown, the present invention provides a liquid crystal on silicon display device 200, commonly called LCOS. The device has a semiconductor substrate 201 comprising a surface region and a gate dielectric layer overlying the surface region 205 of the semiconductor substrate. Preferably, the substrate comprises silicon or single crystal silicon. The gate dielectric is gate oxide, oxynitride, or the like. Isolation regions 202 are also included. The isolation regions can be formed via LOCOS or shallow trench isolation, commonly called STI.

The device also has a word line 213 formed overlying the gate dielectric layer overlying the surface region of the semiconductor substrate. The word line can be multilayered, including polysilicon, refractory metal layer, and cap layer, or any combination of these, and the like. The device has a first source/drain region 206 coupled to the word line and a second source/drain region 204 coupled to the word line to form an MOS transistor device from the word line, first source/drain region and second source/drain region. A first interlayer dielectric 207 is formed overlying the word line, first source/drain region, and second source drain region. Preferably, the first interlayer dielectric is planarized.

Referring to FIG. 2, the device has interconnect structures. A first plug structure is formed within a first portion of the first interlayer dielectric and coupled to the first source/drain region. Preferably, a digit line or interconnect 211 is coupled to the first plug structure, as shown. A second plug structure is formed within a second portion of the first interlayer dielectric and coupled to the second source/drain region. The device has a second interlayer dielectric 216 formed overlying the first interlayer dielectric and a bottom electrode structure 217 formed overlying the second interlayer dielectric. Preferably, the bottom electrode structure is coupled to the second plug structure through a via 225 in the second interlayer dielectric. A capacitor dielectric 219 is formed overlying the bottom electrode. A top electrode structure 214 is formed overlying the capacitor dielectric to form a capacitor structure 215 including the bottom electrode structure, the capacitor dielectric, and the top electrode structure. The device has a mirror surface 223 formed overlying the top electrode structure to form a pixel electrode structure and a liquid crystal material provided overlying the mirror surface. Preferably, the mirror surface is formed using an aluminum metal layer 221, which also forms a portion of the capacitor electrode. The capacitor structure is configured to store a voltage potential for the pixel electrode structure to cause an on-state of the liquid crystal material or the capacitor structure is configured to be free from a voltage potential for the pixel electrode structure to cause an off-state of the liquid crystal material. Further details of device structure, including circuit and capacitor are shown.

Figure 3:
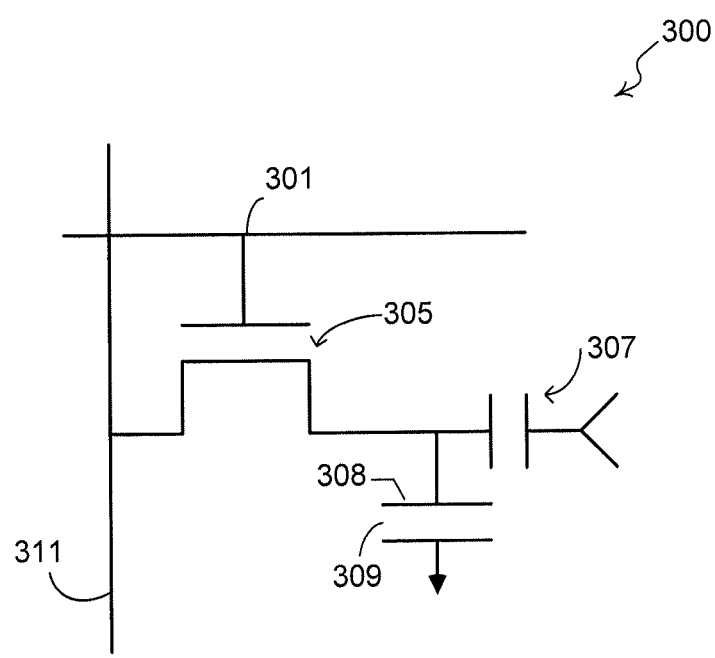
FIG. 3 is a simplified circuit representation of the LCOS device of FIG. 2 according to an embodiment of the present invention.

FIG. 3 is a simplified circuit representation of the LCOS device of FIG. 2 according to an embodiment of the present invention. This diagram is merely an example, which should not unduly limit the scope of the claims herein. One of ordinary skill in the art would recognize many variations, alternatives, and modifications. As shown, the circuit diagram 300 includes an MOS transistor 305, which includes word line 301, and bit line 311. Output of the transistor is coupled to capacitor 307, which holds charge to supply voltage to a lower electrode 308. The lower electrode is coupled to an upper electrode with a liquid crystal material disposed in between the lower and upper electrode. Capacitor 307 has a lower electrode that has been integrated into a single design according to an embodiment of the present invention. Details on ways of fabricating the LCOS device can be found throughout the present specification and more particularly below.

A method for fabricating an electrode structure for an LCOS device according to an embodiment of the present invention may be outlined as follows:

1. providing a semiconductor substrate comprising a surface region;
2. forming a gate dielectric layer overlying the surface region of the semiconductor substrate;
3. forming a word line overlying the gate dielectric layer overlying the surface region of the semiconductor substrate;
4. forming a first source/drain region coupled to the word line;
5. forming a second source/drain region coupled to the word line to form an MOS transistor device from the word line, the first source/drain region and the second source/drain region;
6. forming a first interlayer dielectric overlying the word line, first source/drain region, and second source drain region;
7. forming a first plug structure within a first portion of the first interlayer dielectric, the first plug structure being coupled to the first source/drain region;
8. forming a second plug structure within a second portion of the first interlayer dielectric, the second plug structure being coupled to the second source/drain region;
9. forming a second interlayer dielectric overlying the first interlayer dielectric;
10. forming a bottom electrode structure overlying the second interlayer dielectric, the bottom electrode structure being coupled to the second plug structure through a via structure in the second interlayer dielectric;
11. forming a capacitor dielectric overlying the bottom electrode;
12. forming a top electrode structure overlying the capacitor dielectric to form a capacitor structure including the bottom electrode structure, the capacitor dielectric, and the top electrode structure;
13. forming a mirror surface overlying the top electrode structure to form a pixel electrode structure; and
14. forming a liquid crystal material overlying the mirror surface.

The above sequence of steps provides a method of forming an electrode structure for an LCOS device. As shown, the method includes steps of forming a capacitor structure that uses a largest possible area for the bottom electrode. Depending upon the embodiment, one or more steps may be added, one or more steps may be omitted, one or more steps may be provided in a different sequence without departing from the scope of the invention.

FIGS. 4-13 are simplified diagrams illustrating a method of forming an LCOS device according to an embodiment of the present invention. These diagrams are merely examples, which should not unduly limit the scope of the claims herein. One of ordinary skill in the art would recognize many variations, alternatives, and modifications.

Figure 4:
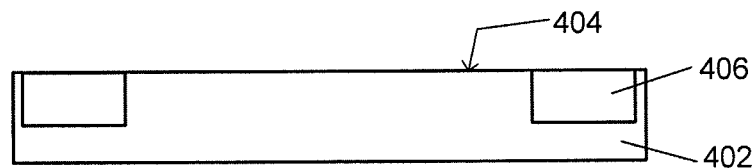
FIGS. 4 through 13 illustrate a method for forming an LCOS device according to an embodiment of the present invention.

As shown in FIG. 4, the method provides a semiconductor substrate 402 including a surface region 404. The semiconductor substrate can be a single crystal silicon, a silicon on insulator substrate, a silicon germanium wafer, among others, depending on the embodiment. In a specific embodiment, the method forms isolation structures 406 to isolate each of the devices. The isolation structure can be LOCOS, field oxide, or shallow trench isolation structures (commonly know as STI) depending on the application.

Figure 5:
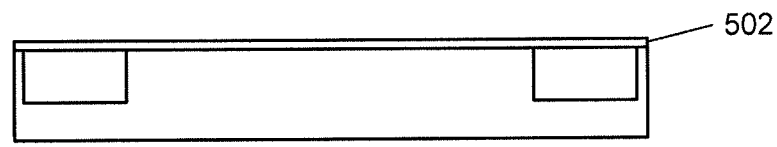

In a specific embodiment, a gate dielectric layer 502 is formed overlying the surface region as shown in FIG. 5. The gate dielectric layer is usually a high density dielectric material such as thermal oxide in a specific embodiment. Other suitable dielectric materials may also be used as gate dielectric depending on the application. These suitable dielectric materials can include silicon nitride or a dielectric stack such as silicon on nitride on silicon oxide commonly known as ONO, and others, depending on the embodiment.

Figure 6:
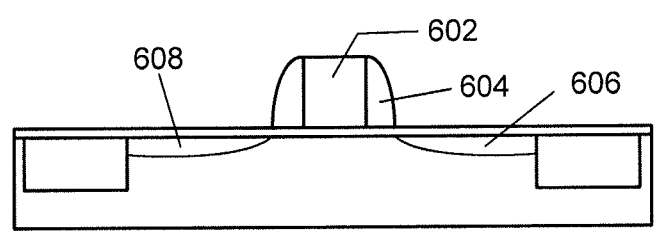

In a specific embodiment, the method forms a word line structure 602 overlying the gate dielectric layer overlying the surface region of the semiconductor substrate as shown in FIG. 6. The word line structure uses a polysilicon gate structure in a specific embodiment. The polysilicon gate structure is formed by depositing a polysilicon material followed by a pattern and etch process. The polysilicon material is usually doped using a suitable impurity to increase the conductivity in situ or ex situ depending on the embodiment. In some embodiments, the polysilicon gate structure can have an optional silicide overlying the polysilicon gate material to further enhance the conductivity and performance of the device. The silicide can be formed using nickel, cobalt and others depending on the embodiment. The polysilicon gate structure can further include sidewall spacer structures 604 overlying the polysilicon gate structure in a specific embodiment. The sidewall spacer structures can be formed by depositing a conformal dielectric layer overlying the polysilicon gate structure including the gate dielectric layer. The conformal dielectric layer can be a silicon oxide such as those deposited using a plasma enhanced TEOS. The conformal dielectric layer can also be a stack dielectric such as an ONO layer. Of course, one skilled in the art would recognize other variations, modifications, and alternatives.

In a specific embodiment, the method includes forming a first source/drain region 606 and a second source/drain region 608 within the semiconductor substrate in a vicinity of the surface region. The source/drain regions may be formed by an implantation process using a suitable impurity species using at least the polysilicon gate structure as a mask. These impurity species can be phosphorus, arsenic, antimony, or bismuth for a n-type impurity. The source/drain regions may also be doped with a n-type impurity provided by a boron species, or others depending on the embodiment. The first source/drain region, the second source/drain region, together with the polysilicon gate structure form a MOS structure for the LCOS device.

Figure 7:
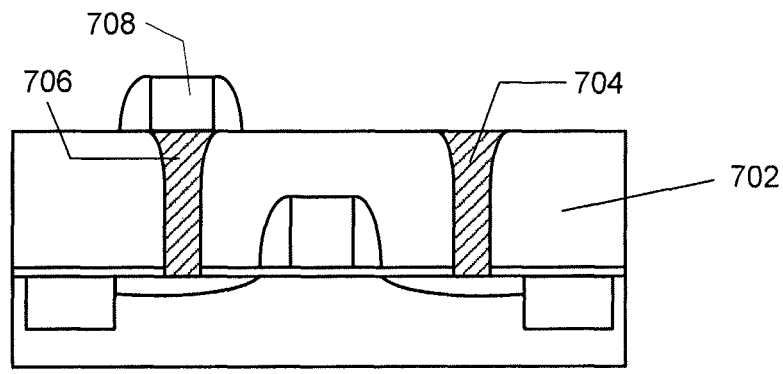

Referring to FIG. 7, the method includes forming a first interlayer dielectric layer 702 overlying the MOS structure including the word line. The first interlayer dielectric can be a doped silicon oxide material such as BPSG and the like. In a specific embodiment, the method includes forming a first plug structure in a portion of the first interlayer dielectric and a second plug structure in a second portion of the first interlayer dielectric. As shown, the first plug structure is coupled to the first source/drain region and the second plug structure is coupled to the second source/drain region. The first plug structure and the second plug structure can be formed using a tungsten plug or a polysilicon plug or an aluminum plug, but can be others depending on the embodiment. In a specific embodiment, the first interlayer dielectric may be subjected to an etch back or a reflow or a combination prior to forming the first plug structure and the second plug structure. The reflow or the etch back process planarizes the first interlayer dielectric allowing for patterning of the first plug structure and the second plug structure. In a preferred embodiment, the first plug structure and the second plug structure may be provided using a landed plug configuration. In some embodiments, a digitline structure 708 coupled to the second plug structure may be formed overlying the first interlayer dielectric. The digitline structure can be formed using a polysilicon gate structure in a specific embodiment. Of course, there can be other variations, modifications, and alternatives.

Figure 8:
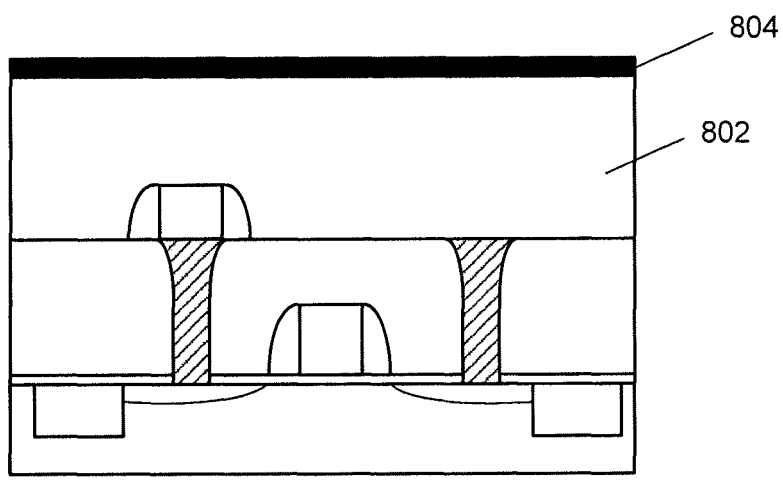

In a specific embodiment, the method includes forming a second interlayer dielectric 802 overlying the first interlayer dielectric layer, the first plug structure, and the second plug structure, which has a planarized surface as shown in FIG. 8. As shown, the second interlayer dielectric overlies the digitline structure. The second interlayer dielectric may be provided using a dielectric material such as PSG or BPSG in a specific embodiment. In a specific embodiment, a planarized second interlayer dielectric is formed and a first electrode layer 804 is provided overlying the planarized second interlayer dielectric surface as shown in FIG. 8. A liner material or a diffusion barrier such as titanium nitride or titanium/titanium nitride usually overlies the second dielectric layer before deposition of the first electrode layer to prevent metal to migrate or diffuse into the second dielectric layer. The first electrode layer functions as a bottom electrode for a capacitor structure, which will be described in more detail below.

Figure 9:
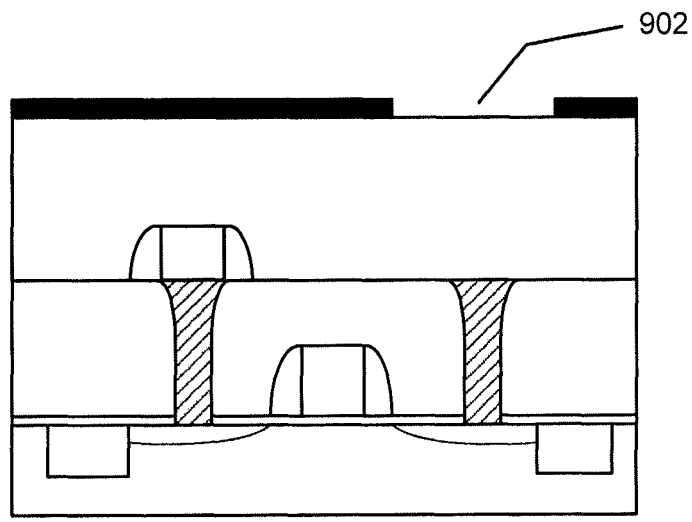
Figure 10:
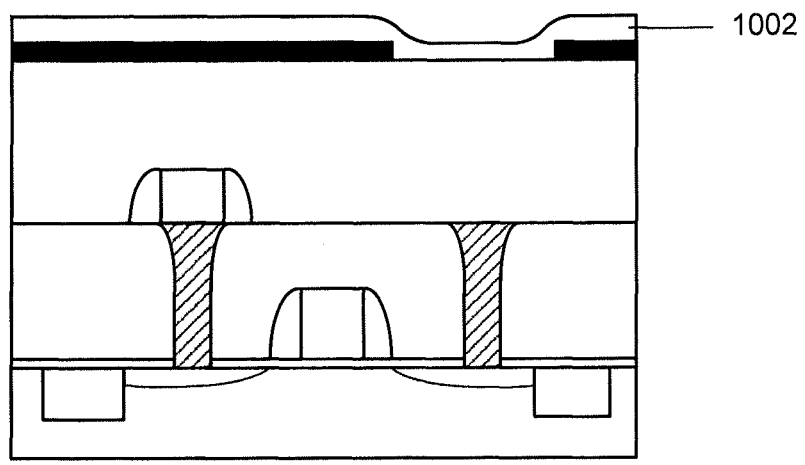

As shown in FIG. 9, the first electrode layer is subjected to a patterning and etch process to form an opening 902 in the first electrode layer. As shown, the opening is substantially aligned with the first plug structure. In alternative embodiments, the method can first form recessed regions in a portion in a vicinity of the surface region of the second interlayer dielectric and the first electrode layer is formed in the recessed regions by a deposition and planarization process, for example, a damascene process. In a specific embodiment, a capacitor dielectric material 1002 is deposited overlying the first electrode structure including the opening region as shown in FIG. 10. The capacitor dielectric material may be aluminum oxide in a preferred embodiment. Other capacitor dielectric materials may also be used depending on the application. These other capacitor dielectric material can include silicon oxide, silicon nitride, a dielectric stack, high K materials (for example tantalum oxide, and the likes), and others.

Figure 11:
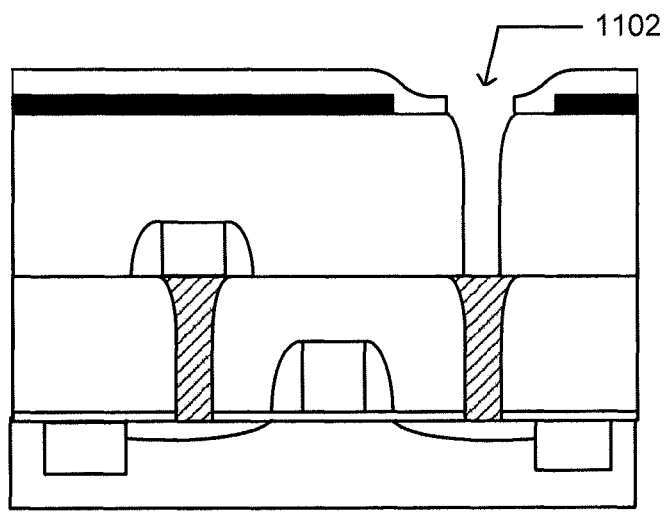

In a specific embodiment, the method for forming an LCOS structure includes forming a via opening 1102 for a via structure in a portion of the capacitor dielectric and a portion of the second interlayer dielectric exposing a top surface region of the first plug structure as shown in FIG. 11. In a specific embodiment, the method includes depositing a diffusion barrier conformal to the via opening and the opening as shown. Depending on the embodiment, the diffusion barrier at a bottom portion of the via structure is partially or completely removed allowing for better electric conductor characteristic of the via structure and the first plug structure. Of course, one skilled in the art would recognize other modifications, variations, and alternatives.

Figure 12:
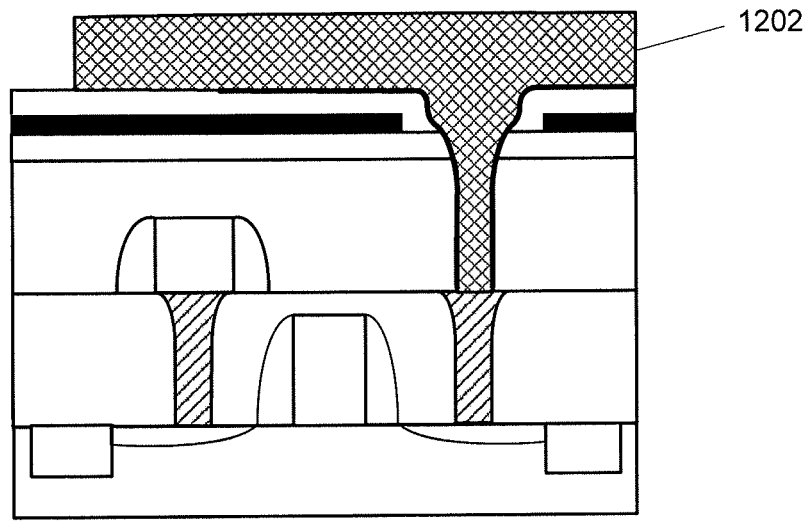

Referring to FIG. 12, the method includes depositing a metal material 1202 overlying the second diffusion barrier to fill the via structure and overlying the capacitor dielectric to provide for a top electrode structure for the capacitor structure. In a preferred embodiment, the metal material is aluminum or aluminum alloy such as aluminum copper alloy but can be others. The method also includes planarizing and polishing the metal material to form a highly reflective surface for a pixel electrode in a specific embodiment. An advantage of the present method is to use the top electrode structure, which has a high reflective surface to provide for a mirror structure and eliminates a further step of forming a mirror structure. Another advantage is that the area of the capacitor is maximized from the top electrode structure, among others.

Figure 13:
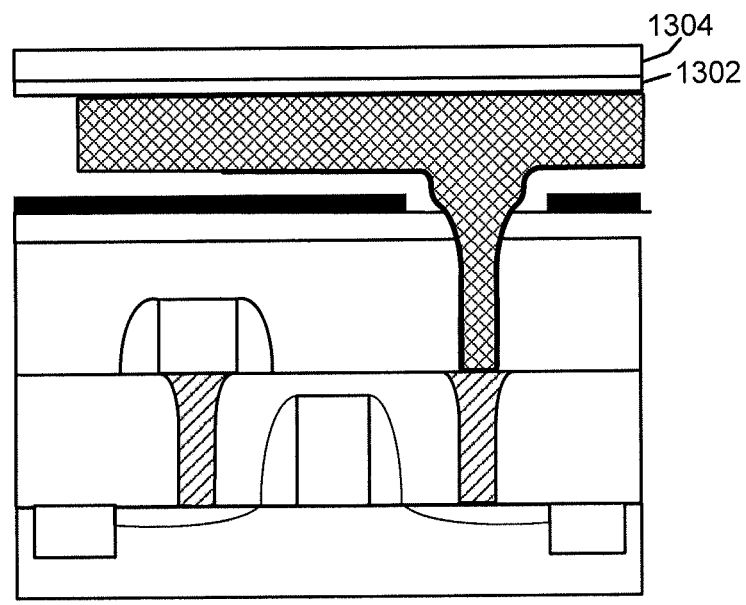

As shown in FIG. 13, to complete the LCOS device structure, the method includes depositing a liquid crystal material 1302 overlying the top electrode structure, which also provides the mirror structure for the LCOS structure. A glass cover 1304 is provided to complete the assembly of the LCOS device. Of course, there can be other variations, modifications, and alternatives.

As described above, in some embodiments, many steps of the method can be used in forming parts of a dynamic random access memory (DRAM) device and an LCOS device. Preferably, embodiments of the invention provide a multi-purpose capacitor design and electrode for LCOS devices. In some embodiments of the invention, an LCOS device and a DRAM device are formed in a single integrated circuit chip. In an embodiment, the integrated circuit chip includes a LCOS device region and a DRAM device region. In one embodiment, the bottom electrode of the LCOS device is a continuous metal plate covering the whole LCOS array except where contact structures are formed. The top electrode serves as a top metal mirror. In contrast, in the DRAM device, the bottom electrode is often connected to a transistor and the top electrode is often used as a ground plane. As can be seen, similar processes can be used in forming the LCOS and the DRAM devices. In an embodiment, the bottom electrodes of the LCOS device and the DRAM device can be formed using the same layer of conductive material. Similarly, the top electrodes of the LCOS and the DRAM device can be formed using the same conductive material. Moreover, many other device components in the LCOS and the DRAM devices can be formed using the same material and/or in the same process steps, for example, the transistors and the wore lines, etc. The integrated circuit chip also includes interconnect structure to configure the devices to form LCOS and DRAM devices, respectively.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A liquid crystal on silicon (LCOS) display device, the device comprising:
   a semiconductor substrate comprising a surface region;
   a gate dielectric layer overlying the surface region of the semiconductor substrate;

a word line formed overlying the gate dielectric layer overlying the surface region of the semiconductor substrate;

a first source/drain region coupled to the word line;

a second source/drain region coupled to the word line to form an MOS transistor device from the word line, the first source/drain region and the second source/drain region;

a first interlayer dielectric formed overlying the word line, the first source/drain region, and the second source drain region;

a first plug structure formed within a first portion of the first interlayer dielectric and coupled to the first source/drain region;

a second plug structure formed within a second portion of the first interlayer dielectric and coupled to the second source/drain region;

a second interlayer dielectric formed overlying the first interlayer dielectric;

a bottom electrode structure formed overlying the second interlayer dielectric, the bottom electrode structure having an opening aligned with the first plug structure;

a capacitor dielectric formed overlying the bottom electrode;

a top electrode structure formed overlying the capacitor dielectric to form a capacitor structure including the bottom electrode structure, the capacitor dielectric, and the top electrode structure;

a via disposed in the second interlayer dielectric and aligned with the first plug structure, the via being configured to electrically couple the top electrode structure with the first plug structure;

a mirror surface formed overlying the top electrode structure to form a pixel electrode structure; and a liquid crystal material provided overlying the mirror surface;

whereupon the capacitor structure is configured to cause an on-state of the liquid crystal material when the capacitor structure holds a voltage potential for the pixel electrode structure, and the capacitor structure is configured to cause an off-state of the liquid crystal material when the capacitor structure is free from a voltage potential for the pixel electrode structure.

2. The device of claim 1 wherein the word line comprises a polysilicon gate structure.

3. The device of claim 1 wherein the first plug structure is a first landing plug structure and the second plug structure is a second landing plug structure.

4. The device of claim 1 wherein the via is provided through an opening within a portion of the bottom electrode structure.

5. The device of claim 1 wherein the bottom electrode structure is provided from a bottom metal layer.

6. The device of claim 1 wherein the bottom metal layer comprises a titanium nitride bearing material.

7. The device of claim 1 wherein the top electrode structure comprises a titanium nitride material overlying the capacitor dielectric.

8. The device of claim 1 wherein the top electrode structure comprises aluminum metallization.

9. The device of claim 1 wherein the capacitor dielectric comprises aluminum oxide.

10. The device of claim 1 wherein the capacitor structure is characterized by a capacitance value of 50 to 90 femtofarads or a capacitance value of about 90 femtofarads.

11. An integrated circuit chip, comprising:

a liquid crystal on silicon (LCOS) display device as recited in claim 1; and a dynamic random access memory (DRAM) device comprising:

a capacitor element comprising:

a lower electrode concurrently formed with a same material as the bottom electrode structure of the LCOS display device;

an upper electrode concurrently formed with a same material as the top electrode structure of the LCOS display device; and a capacitor dielectric disposed between the lower electrode and the upper electrode.

12. A method of forming a liquid crystal on silicon display device, the method comprising:

providing a semiconductor substrate comprising a surface region;

forming a gate dielectric layer overlying the surface region of the semiconductor substrate;

forming a word line overlying the gate dielectric layer;

forming a first source/drain region coupled to the word line;

forming a second source/drain region coupled to the word line to form an MOS transistor device from the word line, the first source/drain region and the second source/drain region;

forming a first interlayer dielectric overlying the word line, first source/drain region, and second source drain region;

forming a first plug structure within a first portion of the first interlayer dielectric, the first plug structure being coupled to the first source/drain region;

forming a second plug structure within a second portion of the first interlayer dielectric, the second plug structure being coupled to the second source/drain region;

forming a second interlayer dielectric overlying the first interlayer dielectric;

forming a bottom electrode structure overlying the second interlayer dielectric, the bottom electrode structure having an opening with the center being aligned with the first plug structure;

forming a capacitor dielectric overlying the bottom electrode structure;

forming a via structure in the second interlayer dielectric through the center of the opening;

forming a top electrode structure overlying the capacitor dielectric to form a capacitor structure including the bottom electrode structure, the capacitor dielectric, and the top electrode structure;

forming a mirror surface overlying the top electrode structure to form a pixel electrode structure; and forming a liquid crystal material overlying the mirror surface;

whereupon the capacitor structure is configured to cause an on-state of the liquid crystal material when the capacitor structure stores a voltage potential for the pixel electrode structure, and the capacitor structure is configured to cause an off-state of the liquid crystal material when the capacitor structure is free from a voltage potential for the pixel electrode structure.

13. The method of claim 12 wherein the word line comprises a polysilicon gate structure.

14. The method of claim 12 wherein the first plug structure is a first landing plug structure and the second plug structure is a second landing plug structure.

15. The method of claim 12 wherein the bottom electrode structure is provided from at least a bottom metal layer.

16. The method of claim 15 wherein the bottom metal layer comprises at least a titanium nitride bearing material.

17. The method of claim 12 wherein the top electrode structure comprises a titanium nitride material overlying the capacitor dielectric.

18. The method of claim 12 wherein the top electrode structure is formed by aluminum metallization.

19. The method of claim 12 wherein the capacitor structure is characterized by a capacitance value of 50 to 90 femtofarads or a capacitance value of about 90 femtofarads.

20. The method of claim 12 wherein the capacitor dielectric comprises at least an aluminum oxide material.

21. The method of claim 12 wherein:
forming a bottom electrode structure of the LCOS display device comprises concurrently forming a bottom electrode in a DRAM region; and
forming a top electrode structure of the LCOS display device comprises concurrently forming a top electrode in the DRAM region.

22. The method of claim 12, wherein forming the top electrode structure comprises filling the via structure.

23. The method of claim 22 further comprising:
forming a conformal diffusion barrier in the via structure; and
removing the conformal diffusion barrier at a bottom portion of the via structure prior to forming the top electrode structure.

* * * * *